United States Patent
Chang et al.

(10) Patent No.: US 9,558,988 B2
(45) Date of Patent: Jan. 31, 2017

(54) METHOD FOR FILLING THE TRENCHES OF SHALLOW TRENCH ISOLATION (STI) REGIONS

(71) Applicant: Taiwan Semiconductor Manufacturing Co., Ltd., Hsin-Chu (TW)

(72) Inventors: Yao-Wen Chang, Taipei (TW); Chia-Shiung Tsai, Hsin-Chu (TW); Cheng-Yuan Tsai, Chu-Pei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/713,425

(22) Filed: May 15, 2015

(65) Prior Publication Data
US 2016/0336217 A1 Nov. 17, 2016

(51) Int. Cl.
*H01L 21/762* (2006.01)
*H01L 21/02* (2006.01)
(Continued)

(52) U.S. Cl.
CPC ... *H01L 21/76224* (2013.01); *H01L 21/02164* (2013.01); *H01L 21/02337* (2013.01);
(Continued)

(58) Field of Classification Search
CPC .......... H01L 21/76224; H01L 29/0649; H01L 21/31144; H01L 21/31051; H01L 21/31155; H01L 21/31111; H01L 21/02337; H01L 21/02164; H01L 21/26586; H01L 21/02348
(Continued)

(56) References Cited

U.S. PATENT DOCUMENTS 6,846,744 B1 * 1/2005 Chen ................ H01L 27/1087
257/E21.233
7,642,171 B2 1/2010 Ingle et al.
(Continued)

OTHER PUBLICATIONS

"1.2 Isolation Techniques;" http://www.iue.tuwien.ac.at/phd/hollauer/node7.html; p. 1-3; Feb. 12, 2015.

*Primary Examiner* — Fernando L Toledo
*Assistant Examiner* — Adam S Bowen
(74) *Attorney, Agent, or Firm* — Eschweiler & Associates, LLC

(57) ABSTRACT

A method for manufacturing a shallow trench isolation (STI) region with a high aspect ratio is provided. A semiconductor substrate is provided with a trench. A first dielectric layer is formed lining the trench. A second dielectric layer is formed filling the trench over the first dielectric layer. In some embodiments, before forming the second dielectric layer, ions are implanted into an implant region of the first dielectric layer that extends along and is limited to a lower region of the trench. In alternative embodiments, after forming the second dielectric layer, an ultraviolet curing process is performed to the second dielectric layer. With the second dielectric layer formed and, in some embodiments, the ultraviolet curing process completed, an annealing process is performed to the second dielectric layer. A semiconductor structure for a STI region is also provided.

20 Claims, 11 Drawing Sheets

(51) Int. Cl.
   *H01L 21/311* (2006.01)
   *H01L 21/3105* (2006.01)
   *H01L 21/3115* (2006.01)
   *H01L 21/265* (2006.01)
   *H01L 29/06* (2006.01)

(52) U.S. Cl.
   CPC .. *H01L 21/02348* (2013.01); *H01L 21/26586* (2013.01); *H01L 21/31051* (2013.01); *H01L 21/31111* (2013.01); *H01L 21/31144* (2013.01); *H01L 21/31155* (2013.01); *H01L 29/0649* (2013.01)

(58) Field of Classification Search
   USPC ........................................................ 257/506
   See application file for complete search history.

(56) References Cited

U.S. PATENT DOCUMENTS

| | | | |
|---|---|---|---|
| 2003/0235959 A1 | 12/2003 | Lichtenberger et al. | |
| 2009/0104790 A1* | 4/2009 | Liang | C23C 16/34 438/788 |
| 2009/0305515 A1* | 12/2009 | Ho | H01L 21/76224 438/778 |
| 2009/0315121 A1* | 12/2009 | Goh | H01L 21/02126 257/396 |
| 2013/0171819 A1* | 7/2013 | Miyajima | H01L 21/76811 438/667 |

\* cited by examiner

METHOD FOR FILLING THE TRENCHES OF SHALLOW TRENCH ISOLATION (STI) REGIONS

BACKGROUND

Over the past four decades, the semiconductor industry has continuously sought to increase the density of integrated circuit components (e.g., transistors, diodes, resistors, capacitors, inductors, etc.). For the most part, improvements in density have come from reductions in feature size, allowing more components to be formed within a given area. As the density between integrated circuit components increases, isolation between components becomes increasingly important. One approach for isolating components is to use shallow trench isolation (STI) regions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
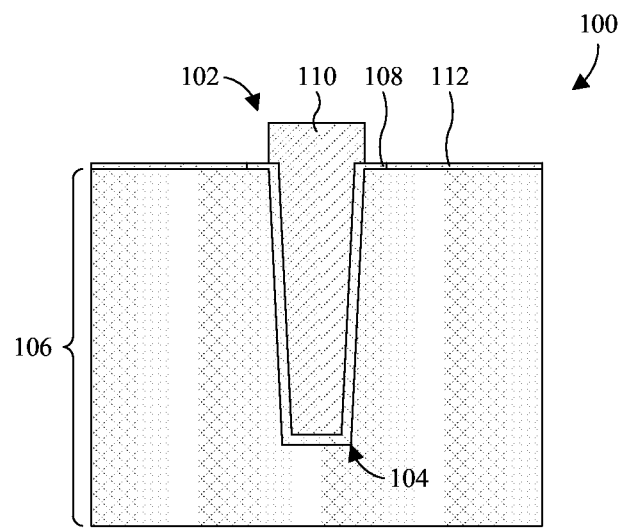
FIG. 1 illustrates a cross-sectional view of some embodiments of a semiconductor structure with a high aspect ratio shallow trench isolation (STI) region.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Moreover, "first", "second", "third", etc. may be used herein for ease of description to distinguish between different elements of a figure or a series of figures. "first", "second", "third", etc. are not intended to be descriptive of the corresponding element. Therefore, "a first dielectric layer" described in connection with a first figure may not necessarily corresponding to a "first dielectric layer" described in connection with another figure.

Shallow trench isolation (STI) regions are commonly used to isolate integrated circuit components. For example, STI regions are often used to isolate memory cell devices from logic devices in embedded flash. A STI region is arranged within a trench of a semiconductor substrate, and includes one or more dielectric layers filling the trench. Often, the STI region includes a first dielectric layer lining the trench and a second dielectric layer filling the remainder of the trench over the lining. STI regions are traditionally formed using high density plasma (HDP) or high aspect ratio process (HARP) trench fill approaches.

As the feature sizes of integrated circuits decrease, the ratio of height to width (i.e., aspect ratio) of STI regions increases. However, this may pose challenges when forming high aspect ratio STI regions according to traditional approaches. For example, for next-generation integrated circuits having feature sizes less than or equal to about 28 nanometers, STI regions typically have aspect ratios exceeding about seven. When traditionally forming an STI region with an aspect ratio exceeding about seven, voids or gaps often develop within the trench. Such voids or gaps may reduce the extent of the isolation provided by the STI region, and hence circuit performance. Further, known approaches to forming an STI region with an aspect ratio exceeding about seven, such as using flowable approaches (e.g., boron and phosphorus doped silicate glass (BSPG)), are expensive.

In view of the foregoing, the present application is directed to an improved method for filling the trench of an STI region, as well as the resulting semiconductor structure. According to the method, a semiconductor substrate with a trench is provided. A dielectric liner is formed lining the trench, and a dielectric filler is formed filling the trench over the dielectric liner using a HARP. With the dielectric filler formed, the dielectric filler undergoes annealing. In some embodiments, an ion implant process may be performed to implant ions into a region of the dielectric layer lining a lower region of the trench before forming the dielectric filler. The dielectric filler forms faster along the lower region of the trench that were implanted with ions, preventing the formation of voids or gaps when the trench has a high aspect ratio (e.g., an aspect ratio exceeding about seven). In alternative or additional embodiments, an ultraviolet curing process may be performed to expose the dielectric filler to ultraviolet light before annealing the dielectric filler. The ultraviolet curing process breaks chemical bonds within the dielectric filler to enhance the efficiency of the annealing and reduce the size of or otherwise remove voids or gaps in the dielectric filler when the trench has a high aspect ratio.

With reference to FIG. 1, a cross-sectional view 100 of some embodiments of a semiconductor structure with a high aspect ratio STI region 102 is provided. The high aspect ratio STI region 102 continuously fills, without gaps or voids, a trench 104 of a semiconductor substrate 106. In some embodiments, the trench 104 may have an aspect ratio exceeding about seven, and/or a width tapering towards a lower surface of the trench 104. In other embodiments, the trench 104 may have an aspect ratio exceeding about twelve, and/or a width tapering towards a lower surface of the trench 104. Further, in some embodiments, the trench 104 may have a depth of about 200-250 nanometers (e.g., 230 nanometers), a width of about 20 to 40 nanometers, and/or sidewalls angled at about 85-93 degrees (e.g., 87 degrees) relative to the lower surface of the trench 104. The semiconductor substrate 106 may be, for example, a bulk silicon substrate or a silicon-on-insulator (SOI) substrate.

The high aspect ratio STI region 102 includes a first dielectric layer 108 lining the trench 104, and a second dielectric layer 110 filling the remainder of the trench 104 over the first dielectric layer 108. In some embodiments, the first dielectric layer 108 partially lines an upper surface of the semiconductor substrate 106 around the trench 104, and/or abuts a third dielectric layer 112 partially lining the upper surface of the semiconductor substrate 106 around the high aspect ratio STI region 102. Further, in some embodiments, the second dielectric layer 110 extends beyond the trench 104 and/or overhangs the upper surface of the semiconductor substrate 106. The first, second, and third dielectric layers 108, 110, 112 may be, for example, an oxide, such as silicon dioxide.

Figure 2:
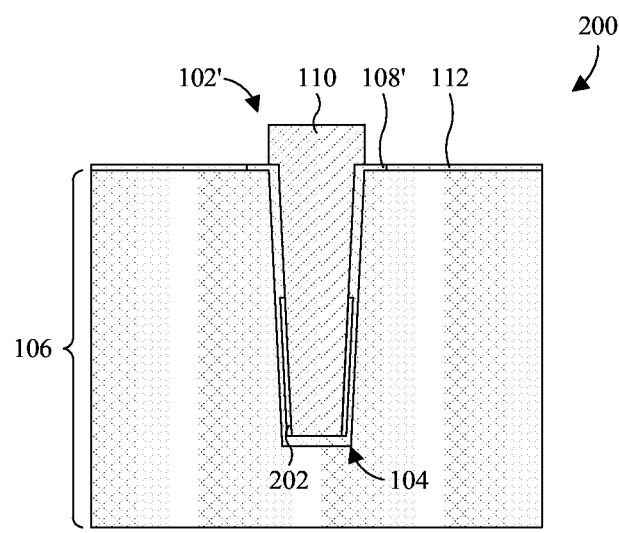
FIG. 2 illustrates a cross-sectional view of other embodiments of a semiconductor structure with a high aspect ratio STI region.

With reference to FIG. 2, a cross-sectional view 200 of other embodiments of a semiconductor structure with a high aspect ratio STI region 102' is provided. The high aspect ratio STI region 102' continuously fills a trench 104 of a semiconductor substrate 106. The high aspect ratio STI region 102' includes a first dielectric layer 108' lining the trench 104, and a second dielectric layer 110 filling the remainder of the trench 104 over the first dielectric layer 108'. In some embodiments, the first dielectric layer 108' partially lines an upper surface of the semiconductor substrate 106 around the trench 104 and/or abuts a third dielectric 112 layer partially lining the upper surface of the semiconductor substrate 106. The first, second, and third dielectric layers 108', 110, 112 may be, for example, an oxide, such as silicon dioxide.

An implanted region 202 of the first dielectric layer 108' that lines a lower region, but not upper region, of the trench 104 has an increased concentration of ions from an inert gas or oxygen gas. The implanted region 202 may, for example, be limited to sidewalls of the trench 104 and/or correspond to a percentage, such as 33% or 50%, of the sidewalls. Further, the implanted region 202 may, for example, extend from a lower surface of the trench 104 and/or extend along the lower surface. For example, the implanted region 202 may correspond to a lower half of the trench 104. As seen hereafter, the increased concentration of ions advantageously increases deposition rate along the implanted region 202 during the formation of the second dielectric layer 110. This advantageously prevents the formation of voids or gaps in the second dielectric layer 110 while filling the trench 104. The inert gas may be, for example, argon gas or nitrogen gas.

Figure 3:
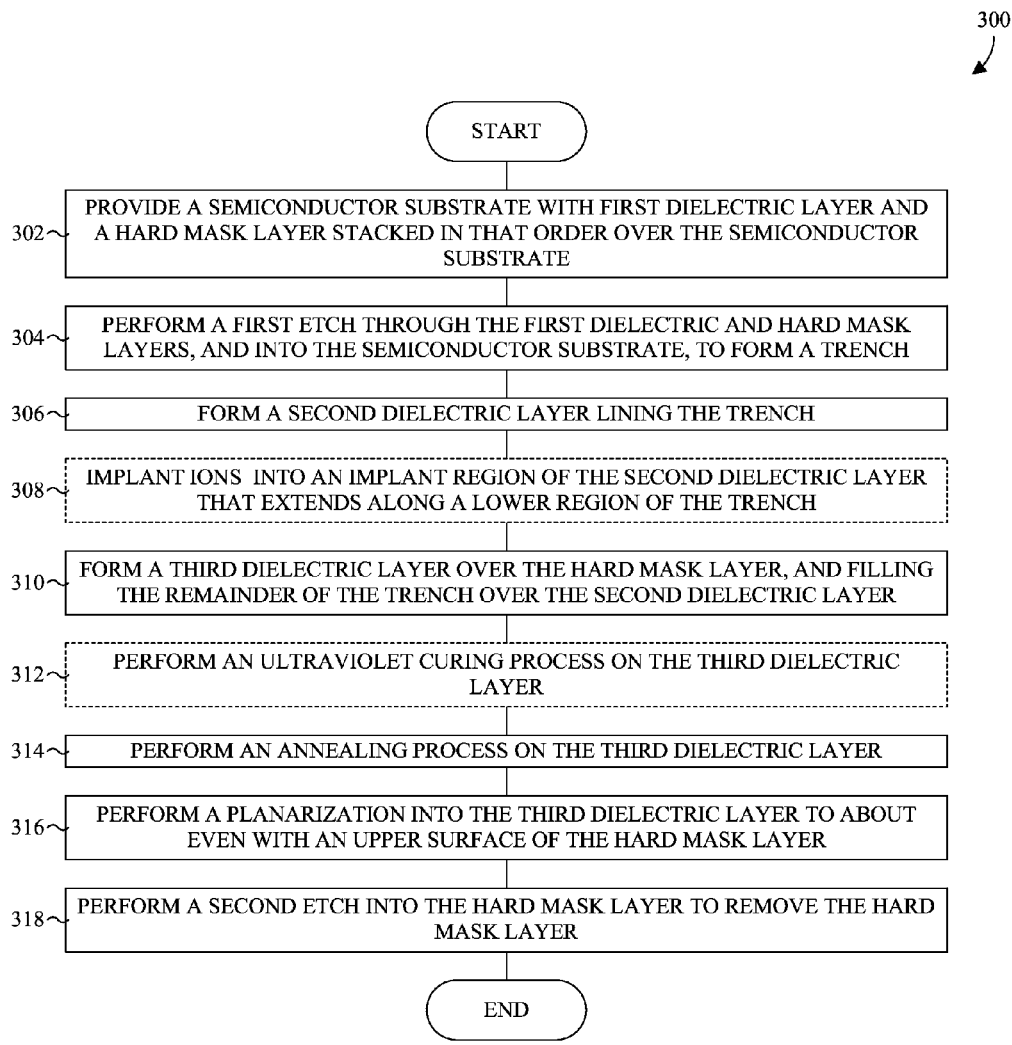
FIG. 3 illustrates a flowchart of some embodiments of a method for manufacturing a semiconductor structure with a high aspect ratio STI region.

With reference to FIG. 3, a flowchart of some embodiments of a method for manufacturing a high aspect ratio STI region is provided.

At 302, a semiconductor substrate with first dielectric layer and a hard mask layer stacked in that order over the semiconductor substrate is provided.

At 304, a first etch is performed through the first dielectric and hard mask layers, and into the semiconductor substrate, to form a trench having a high aspect ratio (e.g., greater than or equal to approximately seven).

At 306, a second dielectric layer is formed lining the trench.

At 308, in some embodiments, ions are implanted into an implant region of the second dielectric layer that extends along a lower region of the trench. The ions may be from an inert gas or oxygen gas. The ion implantation may advantageously cause a subsequently formed third dielectric layer (Act 310) to form faster along the implant region. This prevents the formation of gaps or voids in the third dielectric layer when the aspect ratio is high.

At 310, a third dielectric layer is formed over the hard mask layer, and filling the remainder of the trench over the second dielectric layer. Typically, the third dielectric layer is formed using a HARP.

At 312, in some embodiments, an ultraviolet curing process is performed on the third dielectric layer. The ultraviolet curing process may advantageously break chemical bonds in the third dielectric layer to improve the efficiency of a subsequent annealing process (Act 314). The improved efficiency allows the annealing process to remove or reduce gaps or voids in the third dielectric layer when the aspect ratio is high.

At 314, an annealing process is performed on the third dielectric layer. Typically, the annealing process includes a steam annealing process and a dry annealing process.

At 316, a planarization is performed into the third dielectric layer to about even with a top surface of the hard mask layer.

At 318, a second etch is performed into the hard mask layer to remove the hard mask layer.

While the method described by the flowchart 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 4:
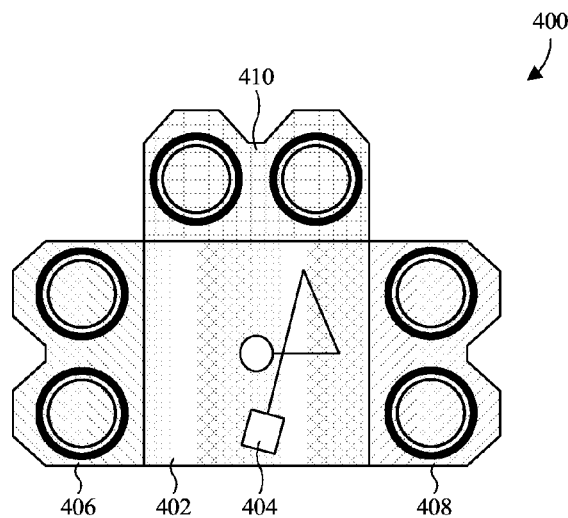
FIG. 4 illustrates a top view of some embodiments of a cluster process tool for manufacturing a high aspect ratio STI region.

With reference to FIG. 4, a top view 400 of some embodiments of a cluster process tool for manufacturing a high aspect ratio STI region according to the method of FIG. 3 is provided. The cluster process tool advantageously allows in-situ formation of the third dielectric layer (see, e.g., Act 310) and one or more of: 1) in-situ performance of the ultraviolet curing process (see, e.g., Act 312); and 2) in-situ ion implantation (see, e.g., Act 308). The cluster process tool includes a central chamber 402 within which a robot 404 is arranged. The robot 404 is configured to move wafers between process modules 406, 408, 410, or chambers of the process modules 406, 408, 410, arranged around the periphery of the central chamber 402. The process modules 406, 408, 410 include a HARP module 408 and one or more of: 1) an ion implant module 410; and 2) an ultraviolet curing module 406. Advantageously, the cluster process tool allows in-situ performance of Acts 308 and/or 312, and Act 310, of the method.

Figure 5:
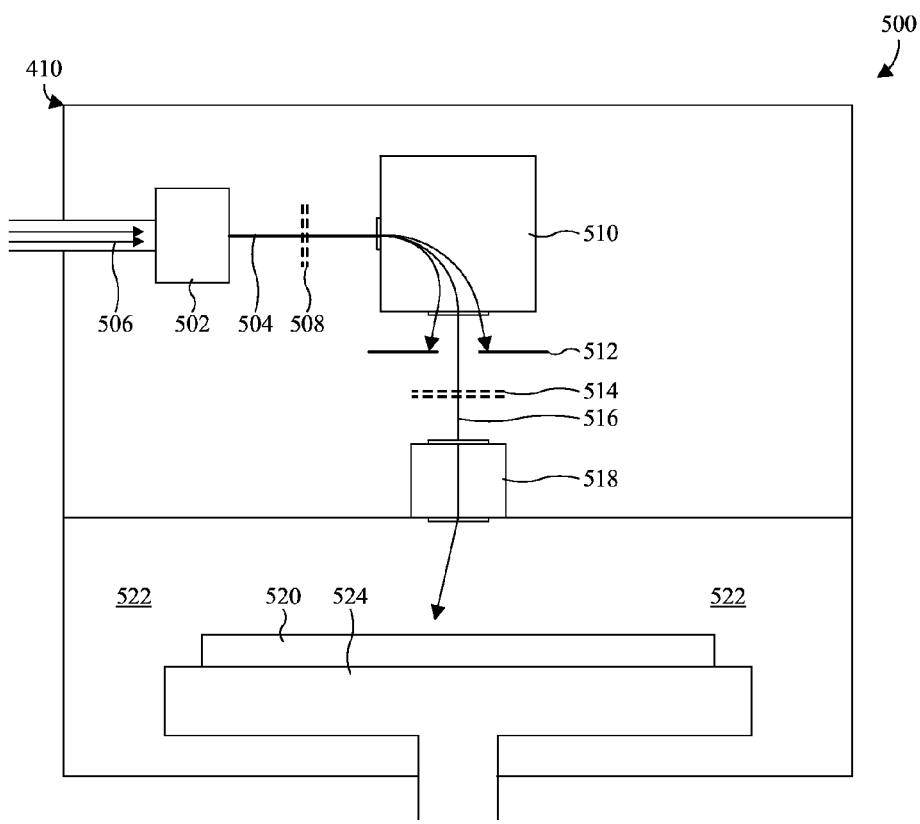
FIG. 5 illustrates a cross-sectional view of some embodiments of an ion implant module for manufacturing a high aspect ratio STI region.

With reference to FIG. 5, a cross-sectional view 500 of some embodiments of an ion implant module 410 is provided. In some embodiments, the ion implant module 410 is a VARIAN VIISTA TRIDENT system. The ion implant module 410 includes an ion source 502 that generates an ion beam 504 from an inert or oxygen gas 506. The inert gas may be, for example, argon or nitrogen gas. The ion beam 504 passes through a first accelerator 508 of the ion implant module 410. The first accelerator 508 electrostatically accelerates the ions of the ion beam 504 towards a separation magnet 510 of the ion implant module 410. The separation magnet 510 curves the ions of the ion beam 504 towards an aperture 512 of the ion implant module 410 to separate the ions by mass. Those ions with a target mass pass through the aperture 512 to a second accelerator 514 of the ion implant module 410. The second accelerator 514 electrostatically accelerates a target ion beam 516 towards a scanner 518, which controls the impingement of the target ion beam 516 on a wafer 520. The wafer 520 is arranged within a chamber 522 and overlies a support structure 524. In some embodiments, the width of the ion beam 516 is less than a width of STI regions upon which the ion beam 516 impinges. For example, the ion beam 516 may have a width of about 20-40 nanometers.

Figure 6A:
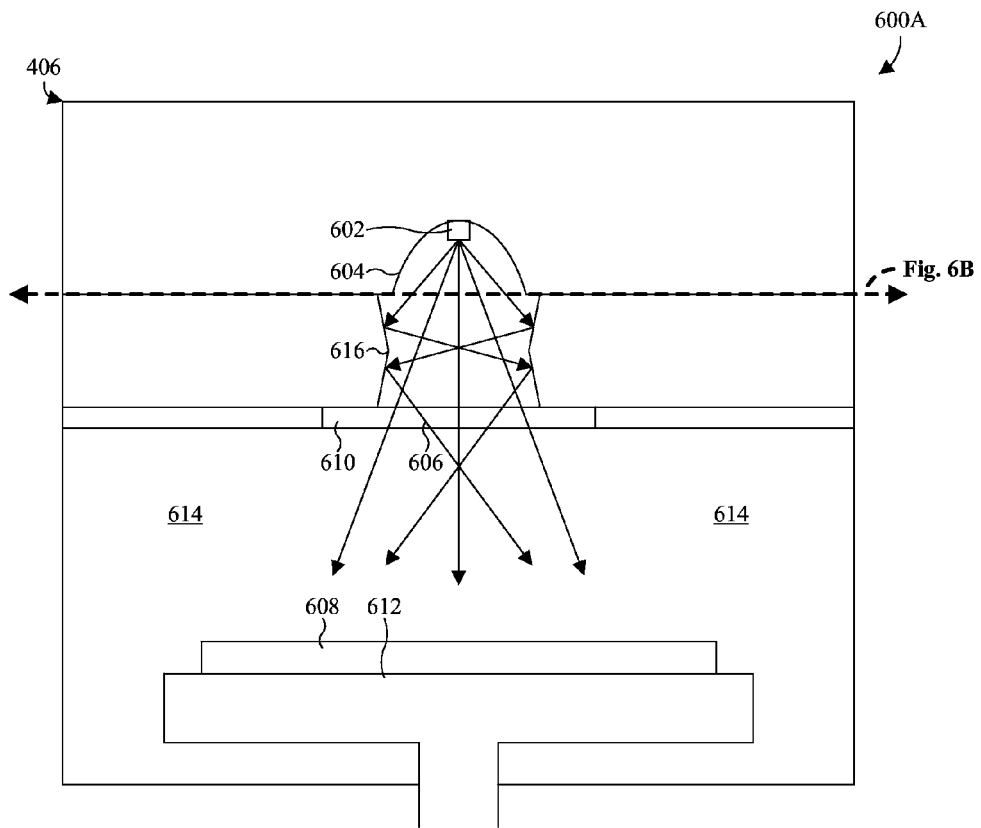
FIG. 6A illustrates a cross-sectional view of some embodiments of an ultraviolet curing module for manufacturing a high aspect ratio STI region.

With reference to FIG. 6A, a cross-sectional view 600A of some embodiments of an ultraviolet curing module 406 is provided. The ultraviolet curing module 406 includes a light source 602 arranged above a primary reflector 604. The light source 602 generates ultraviolet light 606, and the primary reflector 604 directs the ultraviolet light 606 towards a wafer 608. The light source 602 may be fixed or sweeping. As to the latter, the light source 602 may, for example, sweep about 180 degrees about a vertical axis aligned with a center of the wafer 608. The ultraviolet light 606 passes through a window 610 of the ultraviolet curing module 406 and impinges on the wafer 608. The wafer 608 is arranged on a support structure 612 within a chamber 614, and the window 610 overlies the chamber 614. The window 610 may be, for example, quartz. In some embodiments, a secondary reflector 616 is arranged between the primary reflector 604 and the window 610. The secondary reflector 616 captures ultraviolet light destined beyond edges of the wafer 608 and redirects the captured light to the wafer 608 to prevent light loss.

Figure 6B:
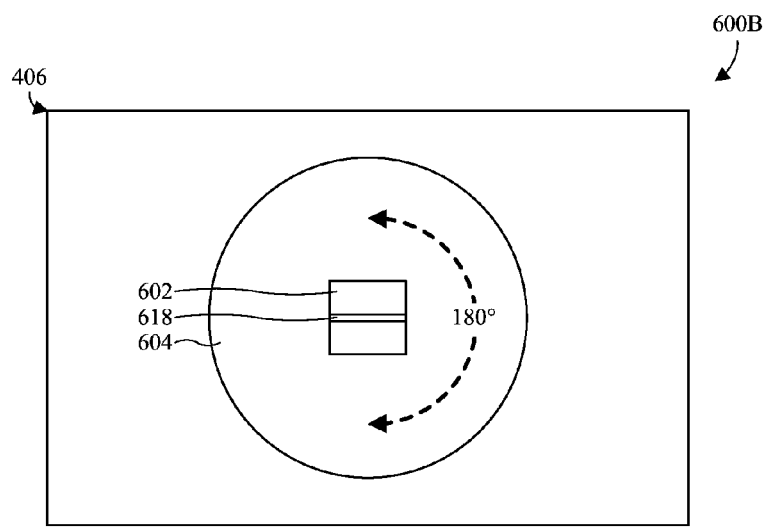
FIG. 6B illustrates a longitudinal view of some embodiments of the ultraviolet curing module of FIG. 6A.

With reference to FIG. 6B, a longitudinal view 600B of some embodiments of the ultraviolet curing module 406 of FIG. 6A, taken along a lower surface of the primary reflector 604, is provided. As illustrated, the light source 602 includes a broadband lamp 618 that moves back and forth about 180 degrees to improve irradiance of the wafer 608. In some embodiments, relative to a fixed light source, irradiance improves from about 476 Watts per meter squared (W/m$^2$) to about 869 W/m$^2$.

With reference to FIGS. 7-9, 10A-E, and 11A-F, cross-sectional views of some embodiments of a semiconductor structure at various stages of manufacture are provided to illustrate the method of FIG. 3. Although FIGS. 7-9, 10A-E, and 11A-F are described in relation to the method, it will be appreciated that the structures disclosed in FIGS. 7-9, 10A-E, and 11A-F are not limited to the method, but instead may stand alone as structures independent of the method. Similarly, although the method is described in relation to FIGS. 7-9, 10A-E, and 11A-F, it will be appreciated that the method is not limited to the structures disclosed in FIGS. 7-9, 10A-E, and 11A-F, but instead may stand alone independent of the structures disclosed in FIGS. 7-9, 10A-E, and 11A-F.

Figure 7:
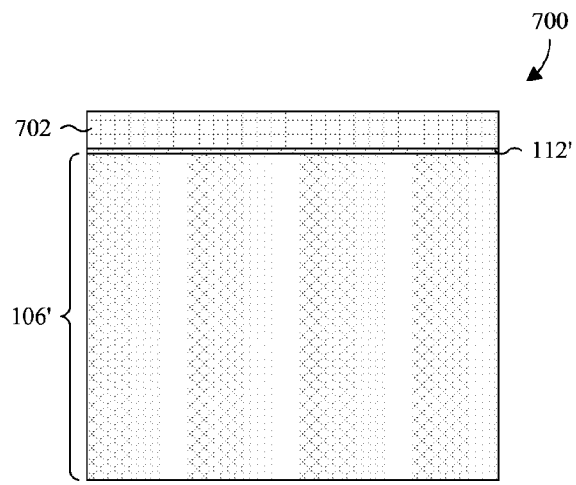
FIGS. 7-9, 10A-E, and 11A-F illustrate a series of cross-sectional views of some embodiments of a semiconductor structure at various stages of manufacture, the semiconductor structure having a high aspect ratio STI region.

FIG. 7 illustrates a cross-sectional view 700 of some embodiments corresponding to Act 302. As illustrated, a semiconductor substrate 106' with a first dielectric layer 112' and a hard mask layer 702 stacked in that order over the semiconductor substrate 106' is provided. The semiconductor substrate 106' may be, for example, a bulk silicon substrate or a SOI substrate. The first dielectric layer 112' may be, for example, an oxide, such as silicon dioxide. The hard mask layer 702 may be, for example, in nitride, such as silicon nitride.

Figure 8:
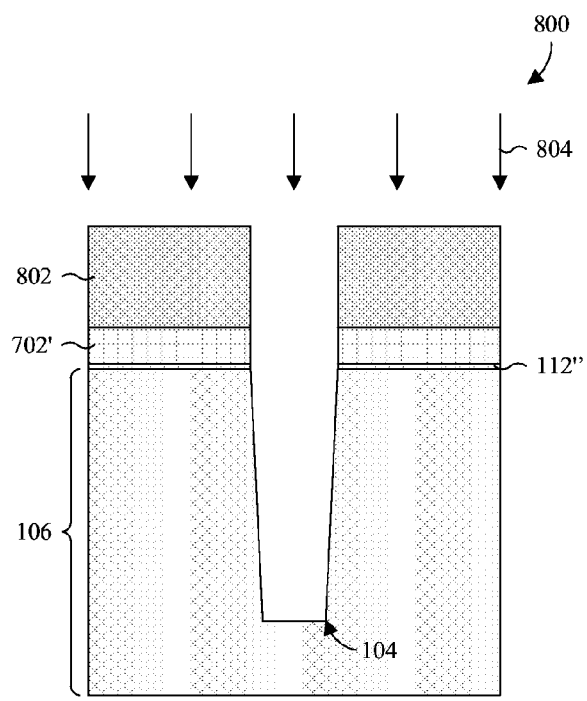

FIG. 8 illustrates a cross-sectional view 800 of some embodiments corresponding to Act 304. As illustrated, a first etch is performed through regions of the first dielectric layer 112', the hard mask layer 702, and the semiconductor substrate 106' to form a trench 104 in the semiconductor substrate 106'. In some embodiments, the trench 104 has a high aspect ratio exceeding, for example, about seven. Further, in some embodiments, the trench 104 has a depth of about 200-250 nanometers (e.g., 230 nanometers), and/or has a width of about 20 to 40 nanometers that tapers. For example, sidewalls of the trench 104 may be angled at approximately 87 degrees from a lower surface of the trench 104.

To perform the first etch, a photoresist layer 802 may be formed over the hard mask layer 702 and masking regions of the hard mask layer 702 surrounding the trench 104. One or more etchants 804 may then be applied to the hard mask layer 702, the first dielectric layer 112', and the semiconductor substrate 106' according to a pattern of the photoresist layer 802. In some embodiments, after applying the one or more etchants 804, the photoresist layer 802 may be stripped or otherwise removed. In alternative embodiments, after applying an etchant to the hard mask layer 702, the photoresist layer 802 may be stripped or otherwise removed. Thereafter, one or more additional etchants 804 may be applied to the first dielectric layer 112' and the semiconductor substrate 106'. In these embodiments, the pattern of the photoresist layer 802 is transferred to the hard mask layer 702, and the remaining hard mask layer 702' is used as a mask for the first dielectric layer 112' and the semiconductor substrate 106'.

Figure 9:
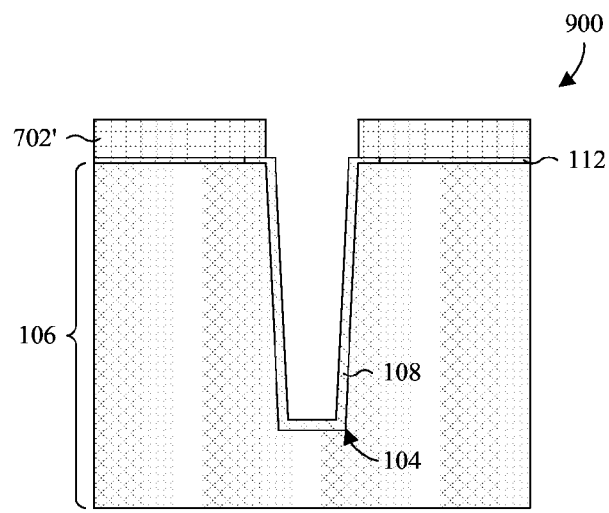

FIG. 9 illustrates a cross-sectional view 900 of some embodiments corresponding to Act 306. As illustrated, a second dielectric layer 108 is formed lining the trench 104. The second dielectric layer 108 is typically formed conformally and with an approximately uniform thickness. In some embodiments, the second dielectric layer 108 extends along an upper surface of the remaining semiconductor substrate 106, under the remaining hard mask layer 702'. In such embodiments, the remaining first dielectric layer 112" is laterally etched back beyond a sidewall of the remaining hard mask layer 702'. The second dielectric layer 108 may be, for example, a dielectric, such as an oxide.

To form the second dielectric layer 108, a second etch may be performed into the remaining first dielectric layer 112" to laterally recess sidewalls of the remaining first dielectric layer 112" relative to sidewalls of the remaining hard mask layer 702'. The etchant of the second etch may be, for example, selective of the remaining first dielectric layer 112" relative to the remaining hard mask layer 702' and/or the remaining semiconductor substrate 106. After performing the second etch, the second dielectric layer 108 may be grown by thermal oxidation on exposed regions of the remaining semiconductor substrate 106. For example, in-situ steam generation (ISSG) may be used for growing the second dielectric layer 108.

FIGS. 10A-E illustrate cross-sectional views 1000A-E for some embodiments of the method of FIG. 3 in which Act 312, but not Act 308, is performed.

Figure 10A:
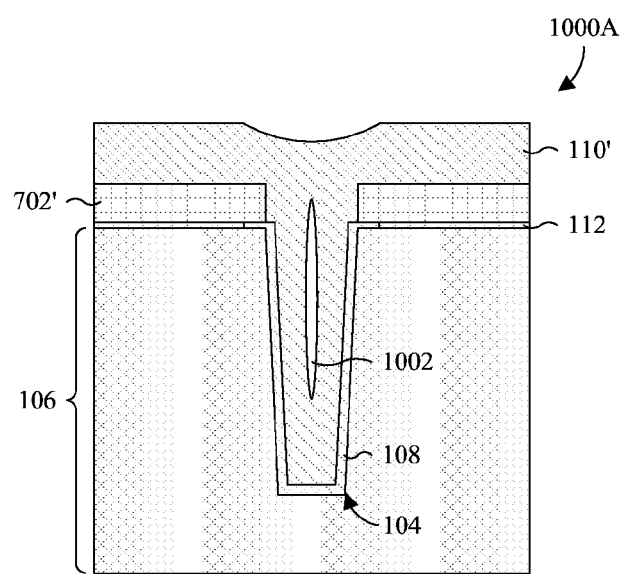

FIG. 10A illustrates a cross-sectional view 1000A of some embodiments corresponding to Act 310. As illustrated, a third dielectric layer 110' is formed over the remaining hard mask layer 702' and the second dielectric layer 108, and filling the remainder of the trench 104. Where the aspect ratio of the trench 104 is high (e.g., exceeding about seven), a void or gap 1002 may form within the third dielectric layer 110'. The third dielectric layer 110' may be formed conformally and/or as, for example, a dielectric, such as an oxide. Further, the third dielectric layer 110' may be formed by, for example, a HARP. The HARP may include, for example, a sub-atmospheric chemical vapor deposition (SACVD) with an ozone ($O_3$) and tetraethoxy silane (TEOS) process chemistry. Further, the HARP may, for example, be performed using the cluster process tool of FIG. 4.

Figure 10B:
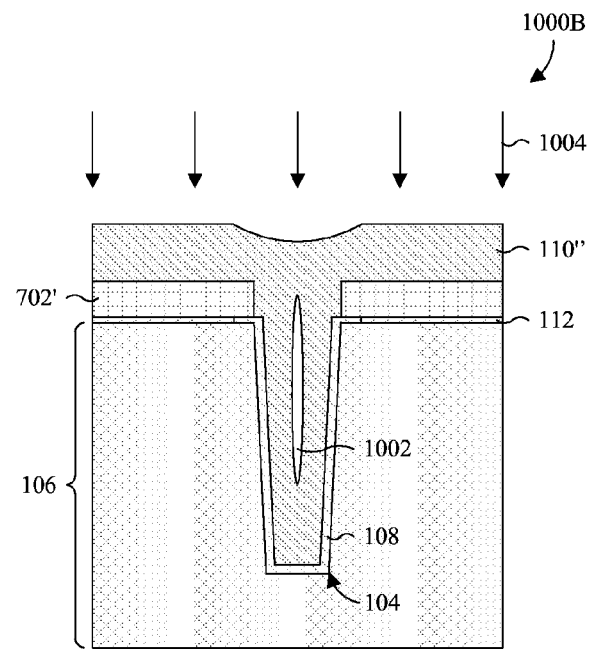

FIG. 10B illustrates a cross-sectional view 1000B of some embodiments corresponding to Act 312. As illustrated, an ultraviolet curing process is performed on the third dielectric layer 110'. The ultraviolet curing process exposes the third dielectric layer 110' to ultraviolet light 1004. The ultraviolet light 1004 may, for example, have a wavelength less than about 250 nanometers, and/or an energy greater than about 5.2 electron volts. Further, the ultraviolet light 1004 may, for example, break bonds between oxygen and an ethyl group ($C_2H_5$) within the third dielectric layer 110'. This advantageously improves annealing efficiency, discussed hereafter. In some embodiments, the ultraviolet curing process is performed using the cluster process tool of FIG. 4 and/or the ultraviolet curing module 406 of FIG. 5.

Figure 10C:
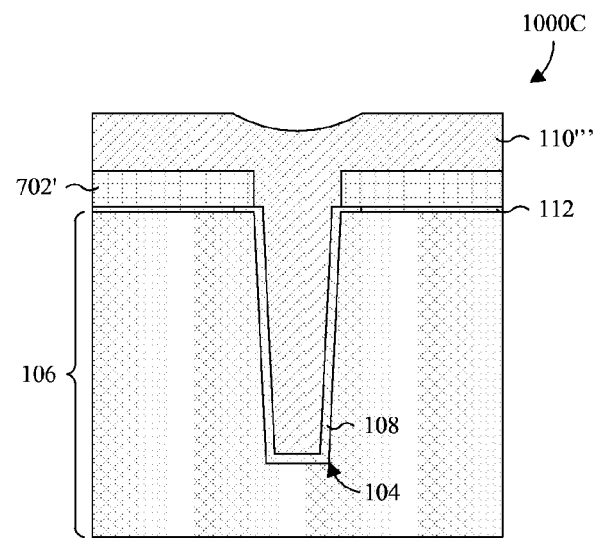

FIG. 10C illustrates a cross-sectional view 1000C of some embodiments corresponding to Act 314. As illustrated, an annealing process is performed on the cured, third dielectric layer 110''. The annealing process includes a steam annealing process and, in some embodiments, a dry annealing process. The efficiency of the annealing process (e.g., the steam annealing process) is enhanced by the ultraviolet curing process, which advantageously leads to removal or reduction in size of any void or gap 1002 in the cured, third dielectric layer 110''. For example, the annealing process may form a compressive film (not shown) compressing the cured, third dielectric layer 110'' and thereby removing or reducing the size of the void or gap 1002. The steam annealing process may, for example, be performed with water ($H_2O$), and the dry annealing may, for example, be performed with nitrogen gas ($N_2$).

Figure 10D:
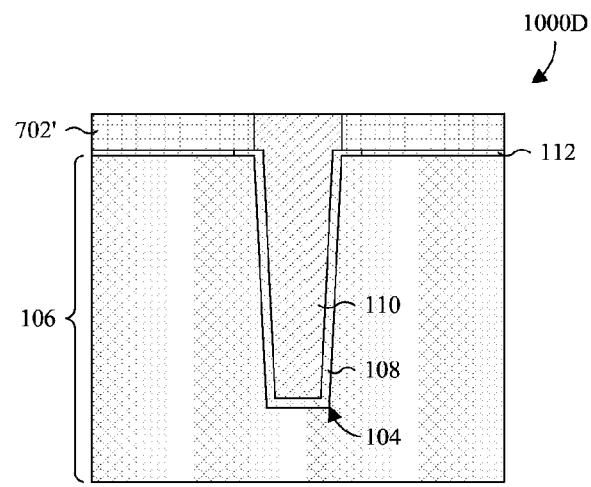

FIG. 10D illustrates a cross-sectional view 1000D of some embodiments corresponding to Act 316. As illustrated, a planarization is performed into the annealed, third dielectric layer 110''' to about even with an upper surface of the remaining hard mask layer 702'. To perform the planarization, a chemical mechanical polish (CMP) and/or etch back may be performed into the annealed, third dielectric layer 110'''.

Figure 10E:
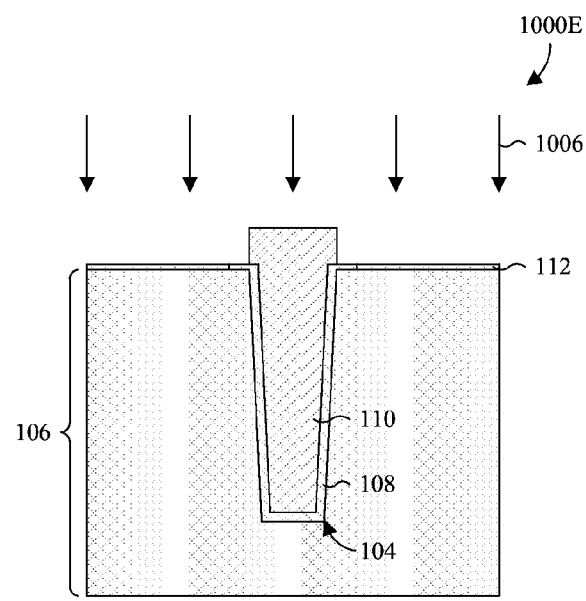

FIG. 10E illustrates a cross-sectional view 1000E of some embodiments corresponding to Act 318. As illustrated, a third etch is performed through the remaining hard mask layer 702' to remove the remaining hard mask layer 702'. The third etch may be performed by applying an etchant 1006 selective of the remaining hard mask layer 702' to the remaining hard mask layer 702'. The etchant 1006 may be, for example, selective of the remaining hard mask layer 702' relative to the remaining first and/or third dielectric layers 110, 112, and/or the second dielectric layer 108.

FIGS. 11A-F illustrate cross-sectional views 1100A-F for some embodiments of the method of FIG. 3 in which Act 308, but not Act 312, is performed.

Figure 11A:
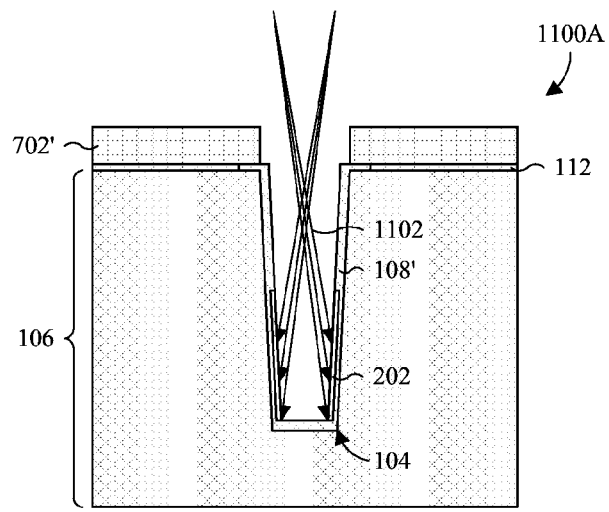

FIG. 11A illustrates a cross-sectional view 1100A of some embodiments corresponding to Act 308. As illustrated, ions 1102 are implanted into an implant region of the second dielectric layer 108 to form an implanted region 202 that extends along a lower region of the trench 104. The implanted region 202 may, for example, be limited to sidewalls of the trench 104 and/or correspond to a percentage, such as 33% or 50%, of the sidewalls. Further, the implanted region 202 may, for example, extend from a lower surface of the trench 104 and/or extend along the lower surface. As discussed hereafter, the ions 1102 may improve the deposition rate along the implanted region 202, which may lead to the lower region of the trench 104 filling faster than an upper region.

The ions 1102 may be generated, for example, from an inert gas, such as argon or nitrogen gas, or from oxygen gas. In some embodiments, where the ions 1102 are generated from argon gas, the second dielectric layer 108 may be implanted with an energy of about 2 watts, a dose of about 3.72E15 ions per centimeter square (ions/$cm^2$), a projected depth of about 62 angstroms, and a concentration of about 6%. In other embodiments, where the ions 1102 are generated from oxygen gas, the second dielectric layer 108 may be implanted with an energy of about 2 watts, a dose of about 5.22E15 ions/$cm^2$, a projected depth of about 87 angstroms, and a concentration of about 6%. Further, the location, concentration, and/or depth of the implanted region 202 may be, for example, controlled by the angle with which the ions impinge on surfaces of the trench 104. That is to say, the location, concentration, and/or depth of the implanted region 202 may be, for example, controlled by the tilt or angle of the ion beam. In some embodiments, the ion implant process is performed using the cluster process tool of FIG. 4 and/or the ion implant module 410 of FIGS. 6A and B. For example, the ion implant process may be performed using a VARIAN VIISTA TRIDENT system and/or with an ion beam width less than a width of the trench 104 (e.g., a width less than about 20-40 nanometers).

Figure 11B:
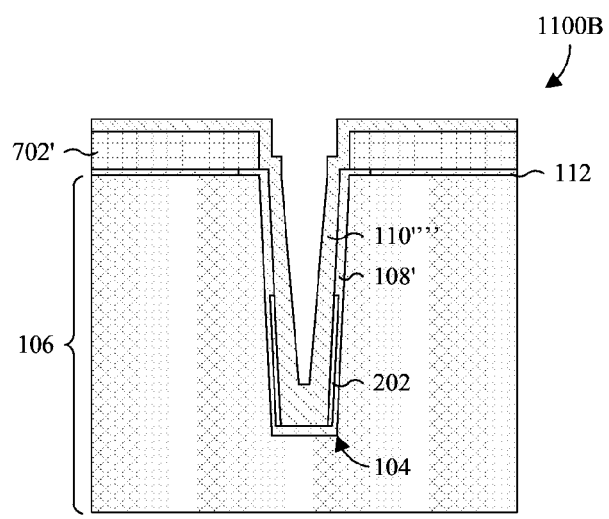
Figure 11C:
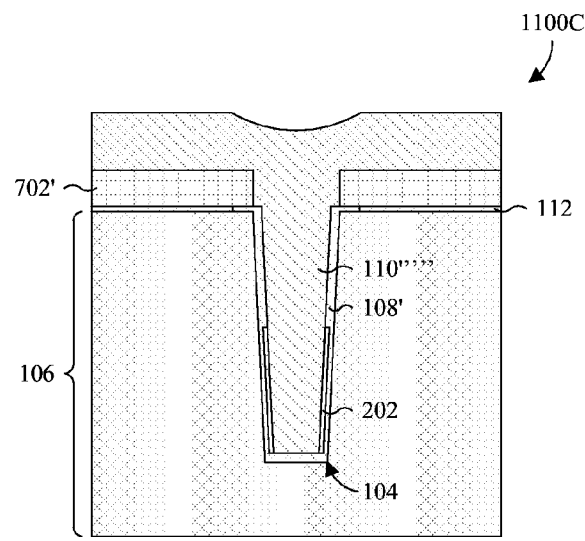

FIGS. 11B & C illustrate cross-sectional views 1100B, 1100C of some embodiments corresponding to Act 310. As illustrated by FIG. 11B, a third dielectric layer 110'''' is partially formed over the remaining hard mask layer 702' and the implanted second dielectric layer 108', and partially filling the remainder of the trench 104. Due to the implanted region 202, the lower region of the trench 104 fills faster and the partially formed third dielectric layer 110'''' is thicker along the lower region. As illustrated by FIG. 11C, a third dielectric layer 110''''' is fully formed over the remaining hard mask layer 702' and the implanted second dielectric layer 108', and filling the remainder of the trench 104. In some embodiments, the third dielectric layer 110'''', 110''''' is formed by a HARP and/or conformally. Advantageously, because the third dielectric layer 110'''', 110''''' forms faster along the lower region of the trench 104, voids or gaps may not form in the third dielectric layer 110'''', 110'''''. Further, in some embodiments, the third dielectric layer 110'''', 110''''' is formed of a dielectric, such as an oxide.

Figure 11D:
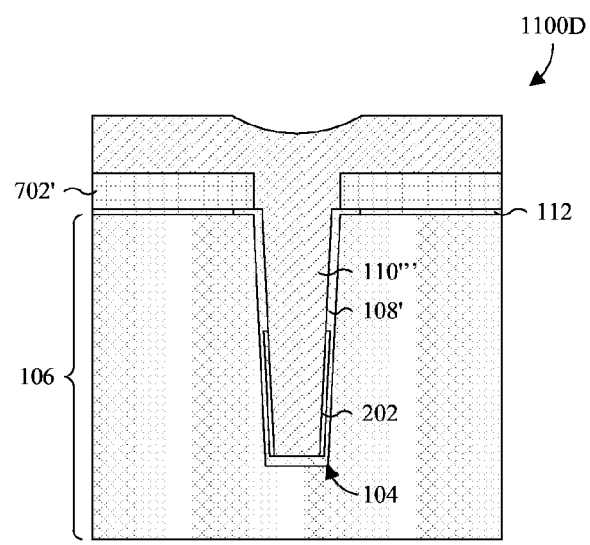

FIG. 11D illustrates a cross-sectional view 1100D of some embodiments corresponding to Act 314. As illustrated, an annealing process is performed on the third dielectric layer 110'''', 110'''''. The annealing process includes a steam annealing process and, in some embodiments, a dry annealing process. The steam annealing process may, for example, be performed with water, and the dry annealing may, for example, be performed with nitrogen gas. In some embodiments, the efficiency of the annealing process (e.g., the steam annealing process) is enhanced by the ion implantation process.

Figure 11E:
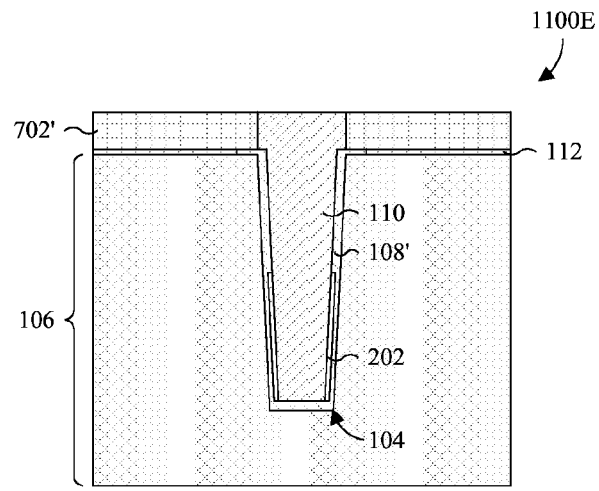

FIG. 11E illustrates a cross-sectional view 1100E of some embodiments corresponding to Act 316. As illustrated, a planarization is performed into the annealed, third dielectric layer 110''' to about even with an upper surface of the remaining hard mask layer 702'. To perform the planarization, a CMP and/or etch back may be performed.

Figure 11F:
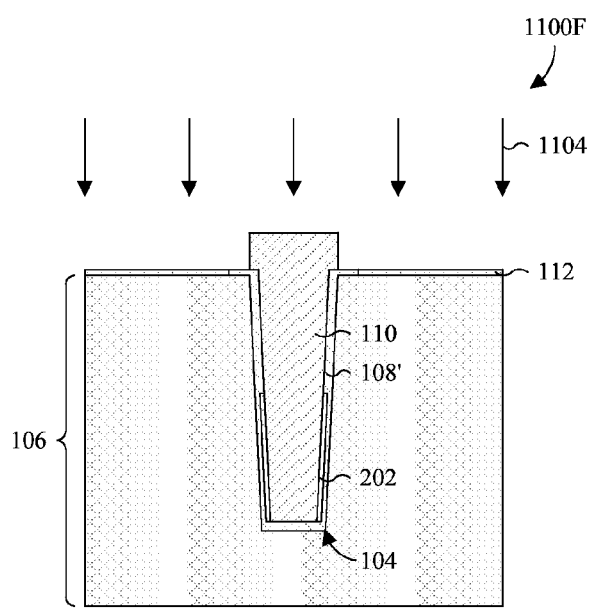

FIG. 11F illustrates a cross-sectional view 1100F of some embodiments corresponding to Act 318. As illustrated, a third etch is performed through the remaining hard mask layer 702' to remove the remaining hard mask layer 702'. The third etch may be performed by applying an etchant 1104 selective of the remaining hard mask layer 702' to the remaining hard mask layer 702'. The etchant 1104 may be, for example, selective of the remaining hard mask layer 702' relative to the remaining first and/or third dielectric layers 110, 112, and/or the implanted second dielectric layer 108'.

Thus, as can be appreciated from above, the present disclosure provides a method for manufacturing a STI region. A semiconductor substrate with a trench is provided. A first dielectric layer is formed lining the trench. A second dielectric layer filling the trench is formed over the first dielectric layer. An ultraviolet curing process is performed to the second dielectric layer. An annealing process is performed to the second dielectric layer.

In other embodiments, the present disclosure provides a method for manufacturing a STI region. A semiconductor substrate is provided with a trench. A first dielectric layer lining the trench is formed. Ions are implanted into an implant region of the first dielectric layer that extends along and is limited to a lower region of the trench. A second dielectric layer is formed filling the trench over the first dielectric layer. An annealing process is performed to the second dielectric layer.

In yet other embodiments, the present disclosure provides a semiconductor structure for a STI region. A semiconductor substrate includes a trench with a ratio of height to width exceeding about 7 to 1. A first dielectric layer lines the trench. A second dielectric layer continuously fills the trench over the first dielectric layer without voids within the second dielectric layer. The second dielectric layer is an oxide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a shallow trench isolation (STI) region, said method comprising:
   providing a semiconductor substrate with a third dielectric layer and a hard mask layer stacked in that order over the semiconductor substrate;
   performing a first etch through regions of the third dielectric layer, the hard mask layer, and the semiconductor substrate to form a trench within the semiconductor substrate;
   forming a first dielectric layer lining the trench;
   forming a second dielectric layer filling the trench over the first dielectric layer;
   performing an ultraviolet curing process to the second dielectric layer;
   performing an annealing process to the second dielectric layer;
   performing a planarization into the second dielectric layer to about even with an upper surface of the hard mask layer; and
   performing a second etch through the hard mask layer to remove the hard mask layer.

2. The method according to claim 1, wherein performing the ultraviolet curing process includes:
   exposing the second dielectric layer to ultraviolet light with a wavelength less than about 250 nanometers.

3. The method according to claim 1, wherein performing the ultraviolet curing process includes:
   sweeping an elongated ultraviolet light source about 180 degrees around a vertical axis approximately aligned with a center of a wafer in which the semiconductor substrate is arranged.

4. The method according to claim 1, wherein forming the second dielectric layer includes:
   performing a high aspect ratio process (HARP).

5. The method according to claim 1, wherein performing the annealing process includes:
   performing a steam annealing process; and
   performing a dry annealing process.

6. The method according to claim 1, wherein the second dielectric layer comprises silicon dioxide ($SiO_2$).

7. A method for manufacturing a shallow trench isolation (STI) region, said method comprising:
   providing a semiconductor substrate with a trench;
   forming a first dielectric layer lining the trench;
   implanting ions into an implant region of the first dielectric layer that extends along and is limited to a lower region of the trench;
   after implanting the ions, forming a second dielectric layer filling the trench over the first dielectric layer; and
   performing an annealing process to the second dielectric layer.

8. The method according to claim 7, further including:
   generating the ions from an inert gas or oxygen gas.

9. The method according to claim 7, wherein implanting ions includes:
   tilting an ion beam to localize ions to the implant region of the first dielectric layer.

10. The method according to claim 7, wherein forming the second dielectric layer includes:
    performing a high aspect ratio process (HARP).

11. The method according to claim 7, wherein performing the annealing process includes:
    performing a steam annealing process; and
    performing a dry annealing process.

12. The method according to claim 7, further including:
    forming the trench with a ratio of height to width exceeding about seven to one.

13. The method according to claim 12, further including:
    forming the second dielectric layer of silicon dioxide ($SiO_2$).

14. The method according to claim 7, further including:

providing the semiconductor substrate with a third dielectric layer and a hard mask layer stacked in that order over the semiconductor substrate;

performing a first etch through regions of the third dielectric layer, the hard mask layer, and the semiconductor substrate to form the trench within the semiconductor substrate;

performing a planarization into the second dielectric layer to about even with an upper surface of the hard mask layer; and performing a second etch through the hard mask layer to remove the hard mask layer.

15. A semiconductor structure for a shallow trench isolation (STI) region, said semiconductor structure comprising:

a semiconductor substrate with a trench, wherein the trench has a ratio of height to width exceeding about 7 to 1;

a first dielectric layer lining the trench, wherein the first dielectric layer comprises an implanted region that is implanted with ions and that has a top boundary spaced below an upper surface of the semiconductor substrate; and a second dielectric layer continuously filling the trench over the first dielectric layer without voids within the second dielectric layer, wherein the second dielectric layer is an oxide.

16. The semiconductor structure according to claim 15, wherein the ions are generated from an inert gas or oxygen gas.

17. The semiconductor structure according to claim 15, wherein the implanted region extends from a bottom of the trench, along sidewalls of the first dielectric layer.

18. The semiconductor structure according to claim 15, wherein the implanted region is limited to a lower half of the trench.

19. The method accordingly to claim 7, further comprising:

implanting the ions into the first dielectric layer, such that a top boundary of the implant region is spaced below an upper surface of the semiconductor substrate.

20. The semiconductor structure according to claim 15, wherein the implanted region contacts the second dielectric layer and is laterally spaced from the semiconductor substrate.

* * * * *